United States Patent
Bi et al.

(10) Patent No.: US 11,164,959 B2
(45) Date of Patent: Nov. 2, 2021

(54) VFET DEVICES WITH ILD PROTECTION

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/659,691

(22) Filed: Oct. 22, 2019

(65) Prior Publication Data

US 2020/0051806 A1   Feb. 13, 2020

Related U.S. Application Data

(62) Division of application No. 15/241,795, filed on Aug. 19, 2016, now Pat. No. 10,541,128.

(51) Int. Cl.
*H01L 29/76*   (2006.01)
*H01L 29/66*   (2006.01)
(Continued)

(52) U.S. Cl.
CPC .... *H01L 29/66795* (2013.01); *H01L 21/0206* (2013.01); *H01L 21/0214* (2013.01);
(Continued)

(58) Field of Classification Search
CPC .......... H01L 29/66666; H01L 29/7827; H01L 29/66545; H01L 29/78618; H01L 29/518;
(Continued)

(56) References Cited

U.S. PATENT DOCUMENTS

| | | | |
|---|---|---|---|
| 6,287,939 B1 * | 9/2001 | Huang | H01L 21/76224 |
| | | | 257/E21.546 |
| 6,673,718 B1 | 1/2004 | Lee et al. | |

(Continued)

FOREIGN PATENT DOCUMENTS

| CN | 103579089 A | 2/2014 |
|---|---|---|
| CN | 103855035 A | 6/2014 |

(Continued)

OTHER PUBLICATIONS

List of IBM Patents or Patent Applications Treated as Related; (Appendix P), Date Filed Oct. 22, 2019; 2 pages.

(Continued)

*Primary Examiner* — Shouxiang Hu
(74) *Attorney, Agent, or Firm* — Cantor Colburn LLP; Randall Bluestone

(57) ABSTRACT

A method of forming a semiconductor device and resulting structures having an etch-resistant interlayer dielectric (ILD) that maintains height during a top epitaxy clean by forming a dielectric layer on a semiconductor structure; wherein the dielectric layer includes a first dielectric material; converting at least a portion of the dielectric layer to a second dielectric material; and exposing the portion of the dielectric layer to an etch material; wherein the etch material includes a first etch characteristic defining a first rate at which the etch material etches the first dielectric material; and wherein the etch material further includes a second etch characteristic defining a second rate at which the etch material etches the portion of the dielectric layer; wherein the first rate is different than the second rate.

14 Claims, 13 Drawing Sheets

(51) Int. Cl.
*H01L 21/02* (2006.01)
*H01L 29/786* (2006.01)
*H01L 29/423* (2006.01)
*H01L 29/78* (2006.01)
*H01L 21/28* (2006.01)
*H01L 21/8234* (2006.01)
*H01L 29/51* (2006.01)
*H01L 29/10* (2006.01)
*H01L 29/417* (2006.01)

(52) U.S. Cl.
CPC .. *H01L 21/02247* (2013.01); *H01L 21/28202* (2013.01); *H01L 21/823431* (2013.01); *H01L 21/823481* (2013.01); *H01L 29/1037* (2013.01); *H01L 29/41741* (2013.01); *H01L 29/42392* (2013.01); *H01L 29/518* (2013.01); *H01L 29/66545* (2013.01); *H01L 29/66666* (2013.01); *H01L 29/66742* (2013.01); *H01L 29/785* (2013.01); *H01L 29/7827* (2013.01); *H01L 29/78618* (2013.01); *H01L 29/78642* (2013.01); *H01L 21/02332* (2013.01)

(58) Field of Classification Search
CPC ........... H01L 29/1037; H01L 29/41741; H01L 21/0214; H01L 21/02247; H01L 21/28202; H01L 21/823431; H01L 21/823481; H01L 29/66742; H01L 29/78642; H01L 29/42392; H01L 29/785; H01L 21/0206; H01L 29/66795; H01L 21/02332
See application file for complete search history.

(56) References Cited

U.S. PATENT DOCUMENTS

| | | | |
|---|---|---|---|
| 7,271,103 | B2 | 9/2007 | Huang et al. |
| 8,313,991 | B2 | 11/2012 | Jiang et al. |
| 8,354,719 | B2 * | 1/2013 | Choi ................ H01L 21/76229 |
| | | | 257/347 |
| 8,980,705 | B2 * | 3/2015 | Li ....................... H01L 29/4966 |
| | | | 438/183 |
| 9,391,200 | B2 * | 7/2016 | Liu .......................... G10L 15/16 |
| 2005/0042846 | A1 | 2/2005 | Green |
| 2018/0053844 | A1 | 2/2018 | Bi et al. |

FOREIGN PATENT DOCUMENTS

| | | |
|---|---|---|
| CN | 103887162 A | 6/2014 |
| JP | 07161996 A | 6/1995 |
| JP | 3051807 B2 | 6/2000 |
| KR | 19970077320 A | 12/1997 |
| KR | 100480480 B1 | 3/2005 |
| KR | 1020050108446 A | 11/2005 |
| TW | 200638482 A | 11/2006 |
| TW | I515801 B | 4/2013 |

OTHER PUBLICATIONS

Zhenxing Bi et al."Method for Making VFET Devices With ILD Protection", U.S. Appl. No. 15/241,795, filed Aug. 19, 2016.

* cited by examiner ions of the present invention;
VFET DEVICES WITH ILD PROTECTION

DOMESTIC PRIORITY

This application is a divisional of U.S. application Ser. No. 15/241,795, titled "METHOD FOR MAKING VFET DEVICES WITH ILD PROTECTION" filed Aug. 19, 2016, the contents of which are incorporated by reference herein in its entirety.

BACKGROUND

The present invention relates in general to semiconductor device fabrication methods and resulting structures. More specifically, the present invention relates to fabrication methods and resulting structures for a semiconductor device having an etch-resistant interlayer dielectric (ILD) that maintains height during a top epitaxy clean.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. The fabrication of semiconductor devices frequently requires the production of a uniform and clean surface for future processing.

SUMMARY

According to one or more embodiments of the present invention, a method of fabricating a semiconductor device having an etch-resistant ILD that maintains height during a top epitaxy clean is provided. The method can include forming a dielectric layer on a semiconductor structure; wherein the dielectric layer includes a first dielectric material; converting at least a portion of the dielectric layer to a second dielectric material; and exposing the portion of the dielectric layer to an etch material; wherein the etch material includes a first etch characteristic having a first rate at which the etch material etches the first dielectric material; and wherein the etch material further includes a second etch characteristic having a second rate at which the etch material etches the portion of the dielectric layer; wherein the first rate is different than the second rate.

According to one or more embodiments of the present invention, a method of fabricating a semiconductor device having an etch-resistant ILD that maintains height during a top epitaxy clean is provided. The method can include forming a dielectric layer on a semiconductor structure; wherein the dielectric layer includes a first dielectric material; contacting a portion of the dielectric layer with a plasma treatment to form a second dielectric material in the portion of the dielectric layer; and exposing the portion of the dielectric layer to an etch material; wherein the etch material includes a first etch characteristic having a first rate at which the etch material etches the first dielectric material; and wherein the etch material further includes a second etch characteristic having a second rate at which the etch material etches the second dielectric material; wherein the first rate is greater than the second rate.

According to one or more embodiments of the present invention, a structure having an etch-resistant ILD that maintains height during a top epitaxy clean provided. The structure can include a semiconductor structure; a dielectric layer formed on the semiconductor structure; a first material implanted in a first portion of the dielectric layer to form a second material, the second material having a higher etch resistance than the dielectric layer with respect to an etch material; and a top epitaxy region formed on a pre-cleaned surface of a semiconductor fin of the semiconductor structure.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
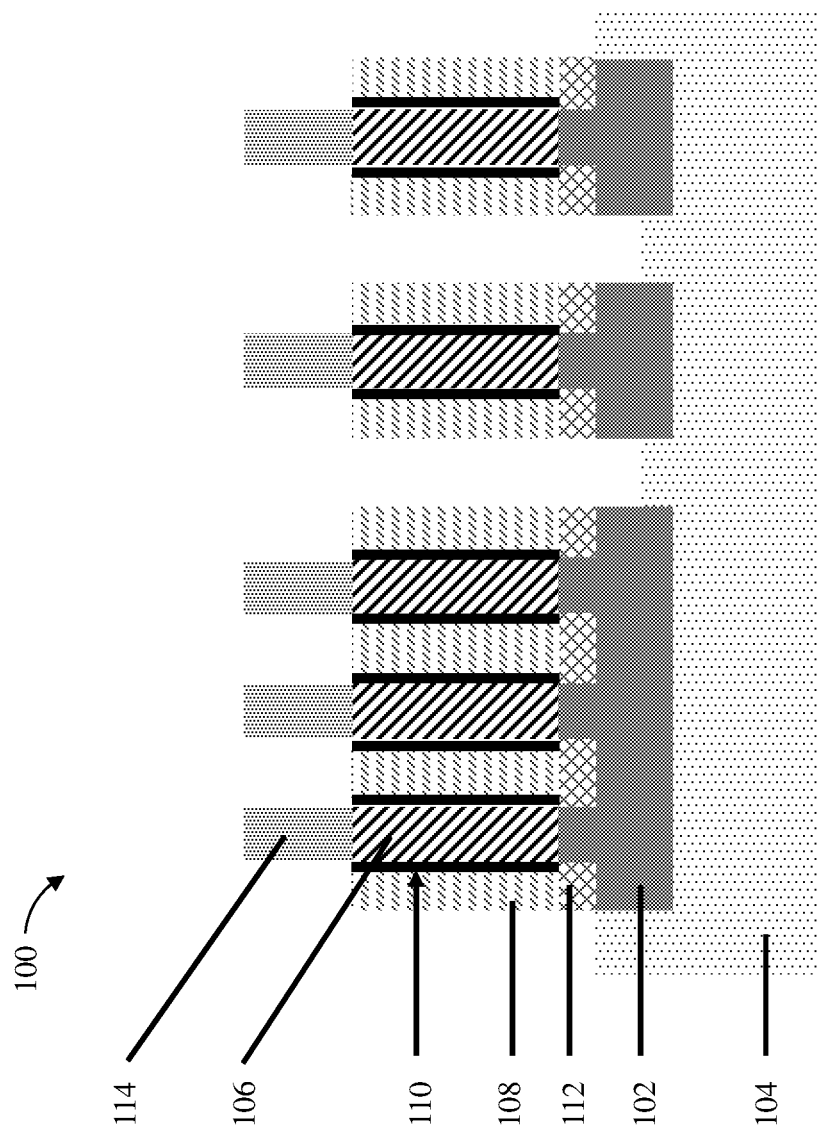
FIG. 1 depicts a cross-sectional view of a structure having a bottom epitaxy region formed on a substrate during an intermediate operation of a method of fabricating a semiconductor device according to one or more embodiments of the present invention.

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having an etch-resistant ILD that maintains height during a top epitaxy clean according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as vertical field effect transistors (VFETs), employ semiconductor fins and side-gates that can be contacted outside the active region, resulting in increased device density and performance over lateral devices. The fabrication of semiconductor devices frequently requires the production of a uniform and clean surface for future processing. Contaminants on the surface of a semiconductor fin, for example, can undermine device performance by causing defects in the top source/drain epitaxy formed on the top portion of the fin. Removal of these contaminants therefore can lead to increased device performance and reliability. As the features of microelectronic devices are reduced in size and increase in aspect ratio, it can be increasingly difficult to effectively clean a fin surface without causing damage to the surrounding ILD.

The fabrication of VFET semiconductor structures requires an aggressive epitaxy pre-clean to completely remove any native oxide on the semiconductor fins prior to forming a top epitaxy source/drain. Pre-cleaning the fin surface to remove the native oxide and any other impurities or contaminants increases the interface quality between the fin and the top source/drain epitaxial layer being formed on the fin.

Examples of technologies that are available for pre-cleaning the fin surfaces include gas cluster ion beam (GCIB), pre-clean wet etch processes, and pre-clean dry etch processes. GCIB systems use an energetic, directional chemical beam to modify wafer surfaces, providing materials modification and precision corrective etching. Gas cluster ions are ionized aggregates of thousands of gaseous atoms or molecules. In contrast to atomic or molecular ion beams, gas cluster ion beams realize low energy/atom characteristics (energy as low as a few eV per atom). The atoms in a cluster ion are not individually energetic enough to significantly penetrate a surface to cause the residual subsurface damage typically associated with the other types of ion beam processing. The aggregate cluster ions, however, are sufficiently energetic to etch, smooth, or clean a semiconductor surface. Moreover, reactive GCIBs enhance chemical reactions without heating a substrate owing to their dense energy deposition. This dense energy deposition induces multiple collisions near the surface, which cause high yield of sputtering or etching. In this manner, GCIB systems can significantly reduce the surface roughness of a wafer or semiconductor surface.

A pre-clean wet etch process, such as a buffered hydrofluoric acid (BHF) etch, is a material removal process that uses liquid chemicals or etchants to remove materials from a surface. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

One disadvantage commonly encountered in epitaxy pre-clean processes is the loss of ILD height from the top surfaces of the ILD adjacent to fins targeted for cleaning. The loss in ILD height can be substantial and in some applications can be greater than 20% (e.g., a 90 nm thick ILD reduced to 70 nm after epitaxy pre-clean). Decreased ILD heights can cause a variety of downstream processing problems, such as a short top epitaxy or the merging of adjacent epitaxy volumes. Thus, a method is desired for preventing a loss in ILD height during an aggressive epitaxy pre-clean.

One or more embodiments of the present invention provide methods of fabricating a semiconductor device having an etch-resistant ILD that maintains height during a top epitaxy clean. The described methods employ a nitrogen ion implantation or a plasma treatment in a nitrogen environment to selectively convert a portion of an ILD, such as, for example, silicon oxide ($SiO_2$), into an etch-resistant dielectric, such as, for example, SiON. Methods for converting a portion of an ILD into an etch-resistant dielectric and the resulting structures therefrom in accordance with embodiments of the present invention are described in detail below by referring to the accompanying drawings in FIGS. 1-13.

FIG. 1 illustrates a cross-sectional view of a structure 100 having a bottom epitaxy region 102 formed on a substrate 104 during an intermediate operation of a method of fabricating a semiconductor device according to one or more embodiments. The bottom epitaxy region 102 can be a source or drain region formed in the substrate 104 by a variety of methods, such as, for example, diffusion and/or ion implantation. The substrate 104 can be any suitable substrate material, such as, for example, monocrystalline Si, SiGe, SiC, or semiconductor-on-insulator (SOI). For ease of discussion, reference is made to operations performed on and to a single semiconductor fin of the structure 100. It is understood that the structure 100 can include a plurality of semiconductor fins.

A semiconductor fin 106 is formed on the bottom epitaxy region 102. Any known composition and manner of forming the semiconductor fin 106 can be utilized. In some embodiments, a patterned hard mask (not illustrated) is etched to expose portions of the substrate 104. The exposed portions of the substrate 104 can be removed to form a plurality of semiconductor fins. The patterned hard mask is then removed, by either wet or dry etch processes. A gate stack 108 is formed over a channel region of the semiconductor fin 106. Any known composition and manner of forming the gate stack 108 and high-K dielectric region 110 can be utilized. The gate stack 108 can be made of, for example, tungsten (W), during an operation for forming a VFET. In some embodiments, a high-K dielectric region 110 is formed between the gate stack 108 and the semiconductor fin 106 to modify the work function of the gate stack 108. The high-K dielectric region 110 can be made of, for example, $HfO_2$. In some embodiments, a bottom spacer 112 is formed between the gate stack 108 and the bottom epitaxy region 102. The bottom spacer 112 can be any suitable material, such as, for example, a low k nitride, silicon nitride (SiN), silicon oxygen carbonitride (SiOCN), or silicoboron carbonitride (SiBCN). In some embodiments, a hard mask 114 is formed overlying the semiconductor fin 106. The hard mask 114 can be any suitable material, such as, for example, SiN.

Figure 2:
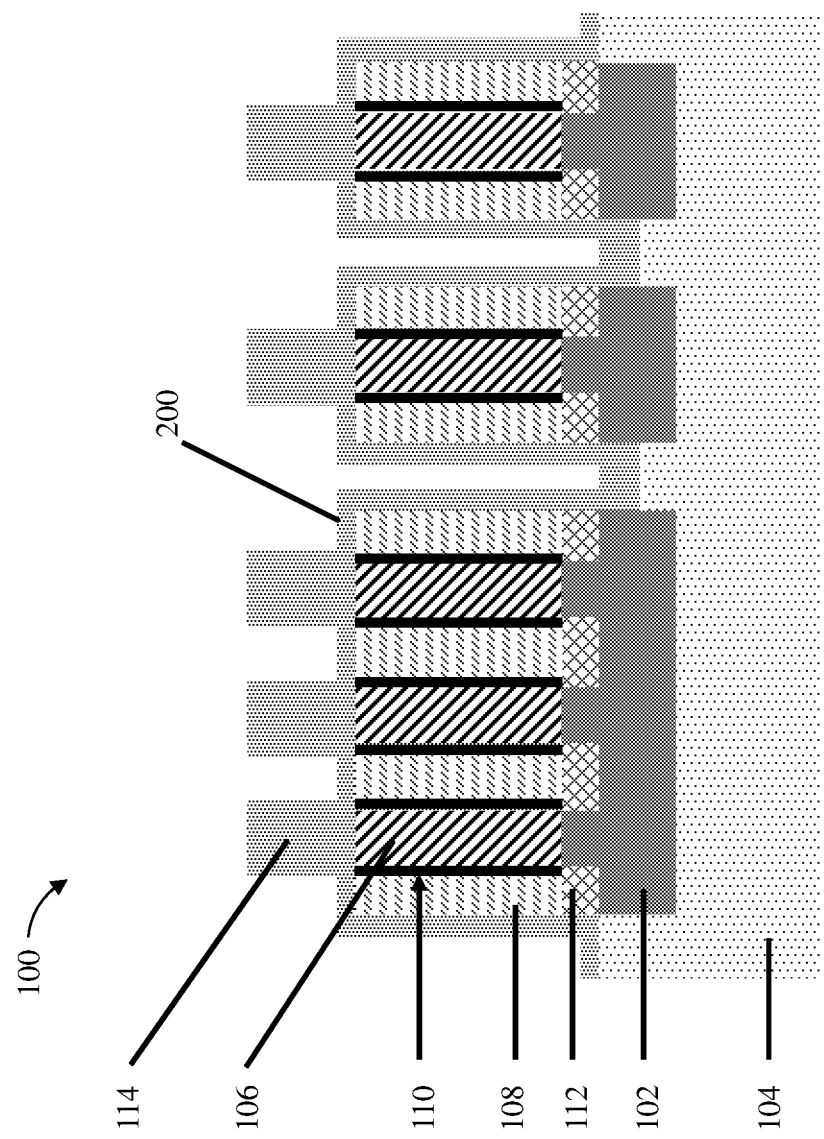
FIG. 2 depicts the cross-sectional view of the structure after forming a conformal liner on the substrate, the gate stack, and the hard mask according to one or more embodiments of the present invention.

FIG. 2 illustrates a cross-sectional view of the structure 100 after forming a conformal liner 200 on the substrate 104, the gate stack 108, and the hard mask 114. The conformal liner 200 serves as a top spacer and can be any suitable material, such as, for example, a SiN or a SiBCN. Any known manner of depositing the conformal liner 200 can be utilized. In some embodiments, the conformal liner 200 can be conformally formed using CVD, plasma-enhanced chemical vapor deposition (PECVD), atomic layer deposition (ALD), evaporation, physical vapor deposition (PVD), chemical solution deposition, or other like processes.

Figure 3:
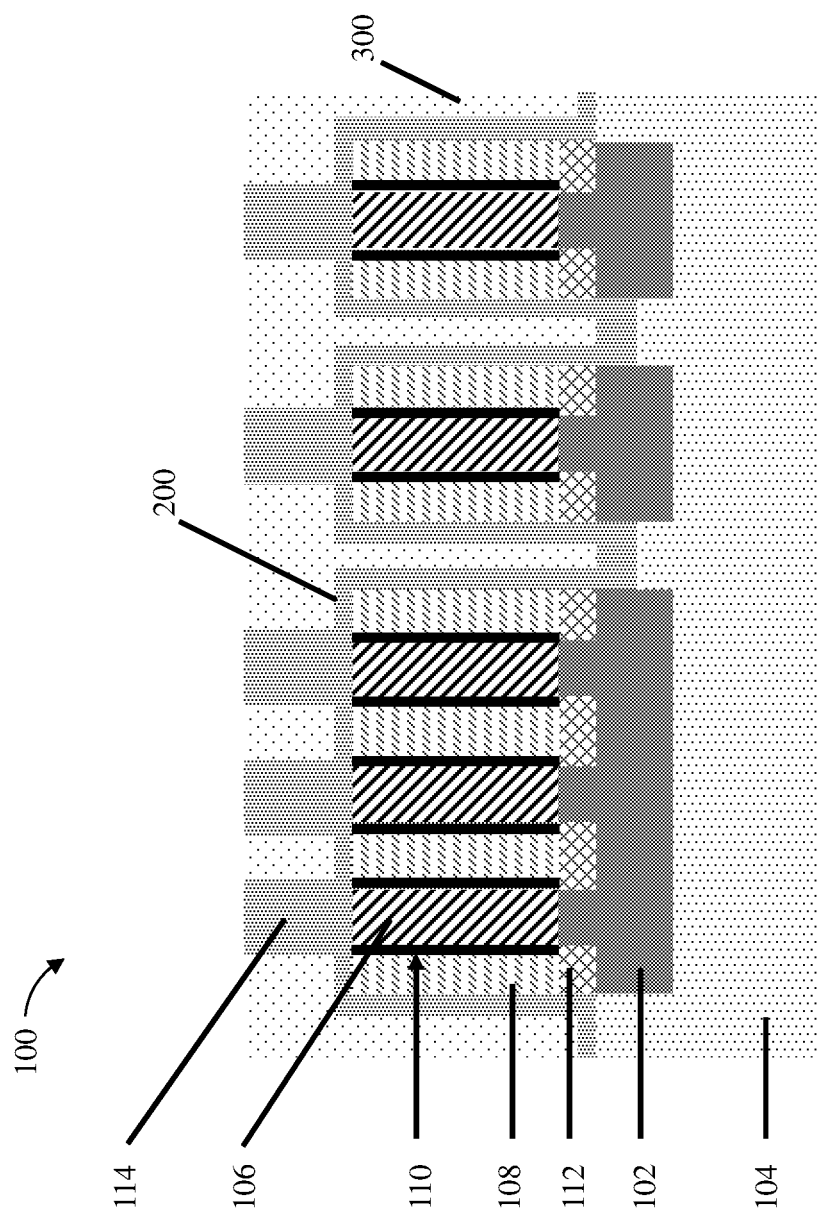
FIG. 3 depicts the cross-sectional view of the structure after forming an ILD on the conformal liner according to one or more embodiments of the present invention.

FIG. 3 illustrates a cross-sectional view of the structure 100 after forming an ILD 300 on the conformal liner 200. Any known composition and manner of forming the ILD 300 can be utilized. In some embodiments, the ILD 300 is deposited by a spin-on coating operation. In still other embodiments, a chemical-mechanical planarization (CMP) selective to the conformal liner 200 is used to remove any excess portion of the ILD 300 (known as overburden) that extends above the top of the conformal liner 200.

Figure 4:
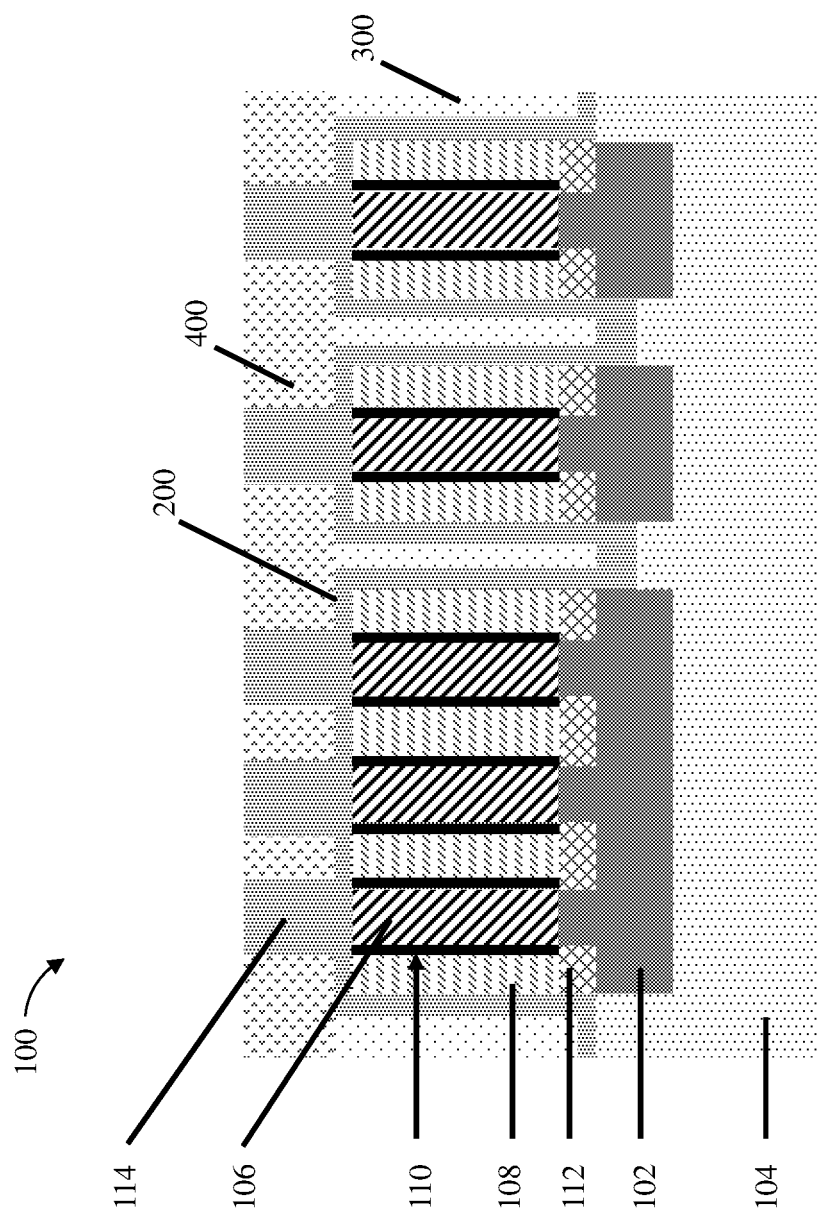
FIG. 4 depicts the cross-sectional view of the structure after forming a region in a top portion of the ILD according to one or more embodiments of the present invention.

FIG. 4 illustrates a cross-sectional view of the structure 100 after forming a region 400 in a top portion of the ILD 300. In some embodiments, the region 400 can be an etch-resistant dielectric having a higher etch resistance than that of the ILD 300. In some embodiments, the ILD 300 can be $SiO_2$ and the region 400 can be SiON. As SiON has a higher etch resistance (i.e., greater than about 3:1) with respect to a dry etch-type epitaxy pre-clean than that of $SiO_2$, the region 400 can have an etch resistance of about three times that of the ILD 300.

In some embodiments, the region 400 can be formed by implanting the top portion of the ILD 300 with a first material to form a second material. Any known manner of implanting the first material in the region 400 of the ILD 300 can be utilized. In some embodiments, the ILD 300 is silicon dioxide ($SiO_2$), the first material is nitrogen, and the second material is a SiON. In some embodiments, a nitrogen ion implantation operation is employed to implant nitrogen into the region 400 to convert the $SiO_2$ in region 400 to SiON. In still other embodiments, a $1.05 \times 10^{12}$ ions/$cm^{-2}$ dose nitrogen ion implantation at 1 keV and room temperature is employed. In some embodiments, the region 400 can have a thickness of about 20 nm. In some embodiments, a first portion of the hard mask (not illustrated) can be implanted with nitrogen during the nitrogen ion implantation operation. In some embodiments, the first portion of the hard mask can have a thickness of about 6 nm.

In other embodiments, the region 400 can be formed by contacting the top portion of the ILD 300 with a plasma treatment to form a first material in the region 400. Any known manner of forming the first material in the region 400 of the ILD 300 can be utilized. In some embodiments, the ILD 300 is silicon dioxide ($SiO_2$) and the first material is a SiON. In some embodiments, the plasma treatment is in a vacuum chamber nitrogen gas environment for nitridation of the $SiO_2$ in the region 400 to form SiON. In some embodiments, the region 400 can have a thickness of about 20 nm.

Figure 5:
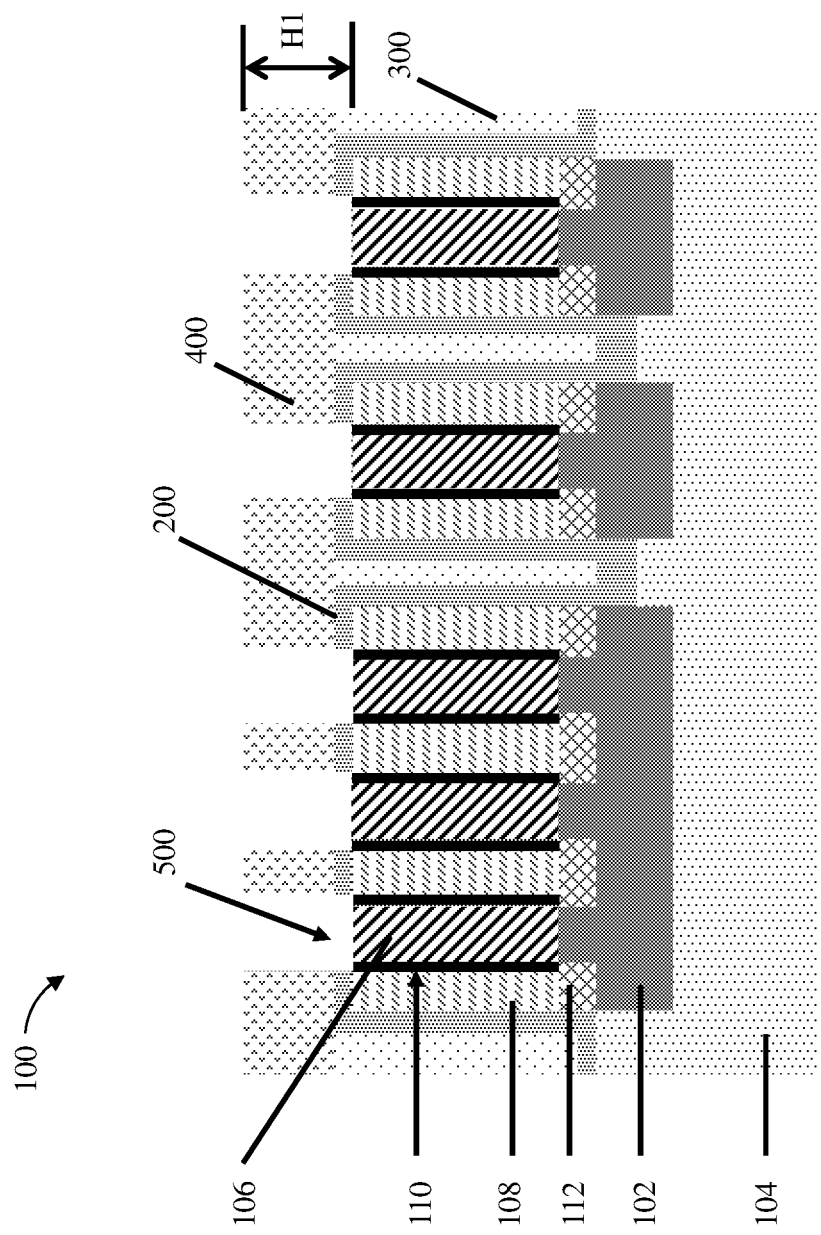
FIG. 5 depicts the cross-sectional view of the structure exposing a surface of the semiconductor fin according to one or more embodiments of the present invention.

FIG. 5 illustrates a cross-sectional view of the structure 100 after exposing a surface 500 of the semiconductor fin 106. Any known manner of exposing the surface 500 can be utilized. In some embodiments, a directional SiN or SiBCN etch back exposes the surface 500. In some embodiments, a height H1 of the ILD 300 and the region 400 above the surface 500 of the semiconductor fin 106 can be about 90 nm.

Figure 6:
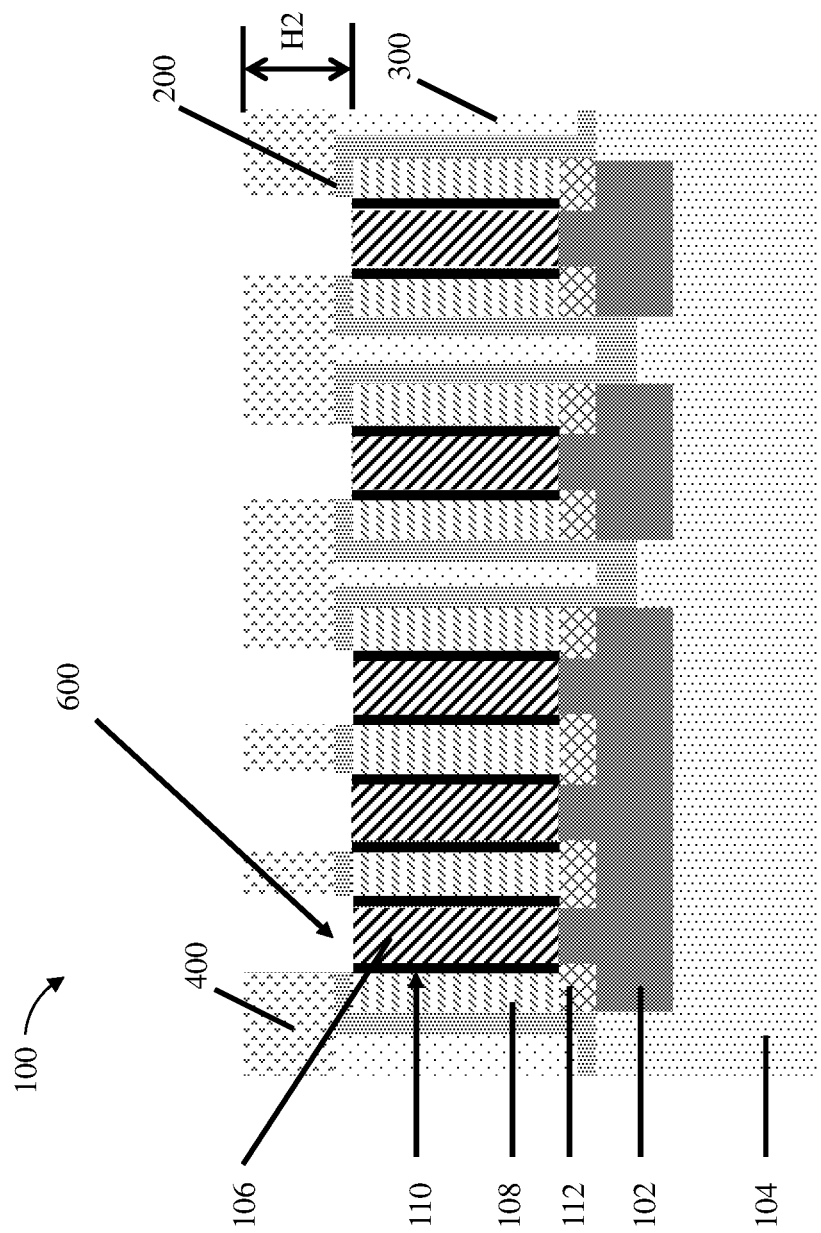
FIG. 6 depicts the cross-sectional view of the structure after pre-cleaning the surface of the semiconductor fin to form a pre-cleaned surface according to one or more embodiments of the present invention.

FIG. 6 illustrates a cross-sectional view of the structure 100 after pre-cleaning the surface 500 of the semiconductor fin 106 to form a pre-cleaned surface 600. As discussed in detail previously, many technologies are available for pre-cleaning fin surfaces. In some embodiments, a wet etch system is used to pre-clean the surface 500. In other embodiments, a dry etch system is used to pre-clean the surface 500. Regardless of the particular system employed to pre-clean the surface 500, the pre-cleaning operation removes any native oxide and any other impurities or contaminants on the surface 500, resulting in a greater interface quality between the pre-cleaned surface 600 and a top source/drain epitaxial layer (illustrated in FIG. 7) formed in a later operation. The pre-cleaning operation reduces the height H1 of the ILD 300 and the region 400 to a height H2. In some embodiments, the height H2 is reduced by less than about two nm due to the region 400 having an etch resistance of about three times that of the ILD 300. In other embodiments, the height H2 is reduced by less than about one nm due to the region 400 having an etch resistance of about three times that of the ILD 300. In this manner, the height of the ILD 300 and the region 400 is substantially preserved during the top epitaxy pre-clean operation.

Figure 7:
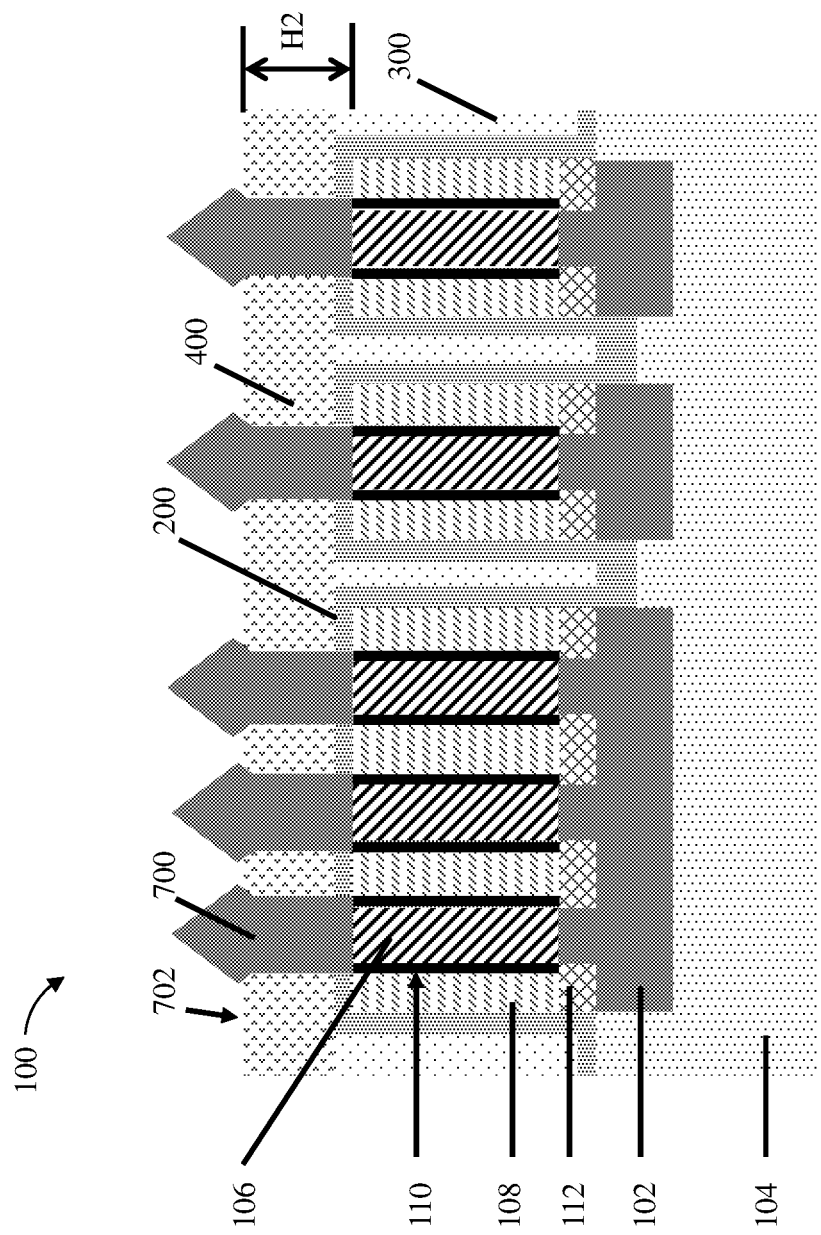
FIG. 7 depicts the cross-sectional view of the structure after forming a top epitaxy region on the pre-cleaned surface of the semiconductor fin according to one or more embodiments of the present invention.

FIG. 7 illustrates a cross-sectional view of the structure 100 after forming a top epitaxy region 700 on the pre-cleaned surface 600 of the semiconductor fin 106. Any known composition and manner of forming the top epitaxy region 700 can be utilized. In some embodiments, a deposition operation such as, for example, CVD, ECD, MBE, or ALD is employed to form the top epitaxy region 700. In some embodiments, the top epitaxy region 700 extends beyond a top surface 702 of the region 400.

Figure 8:
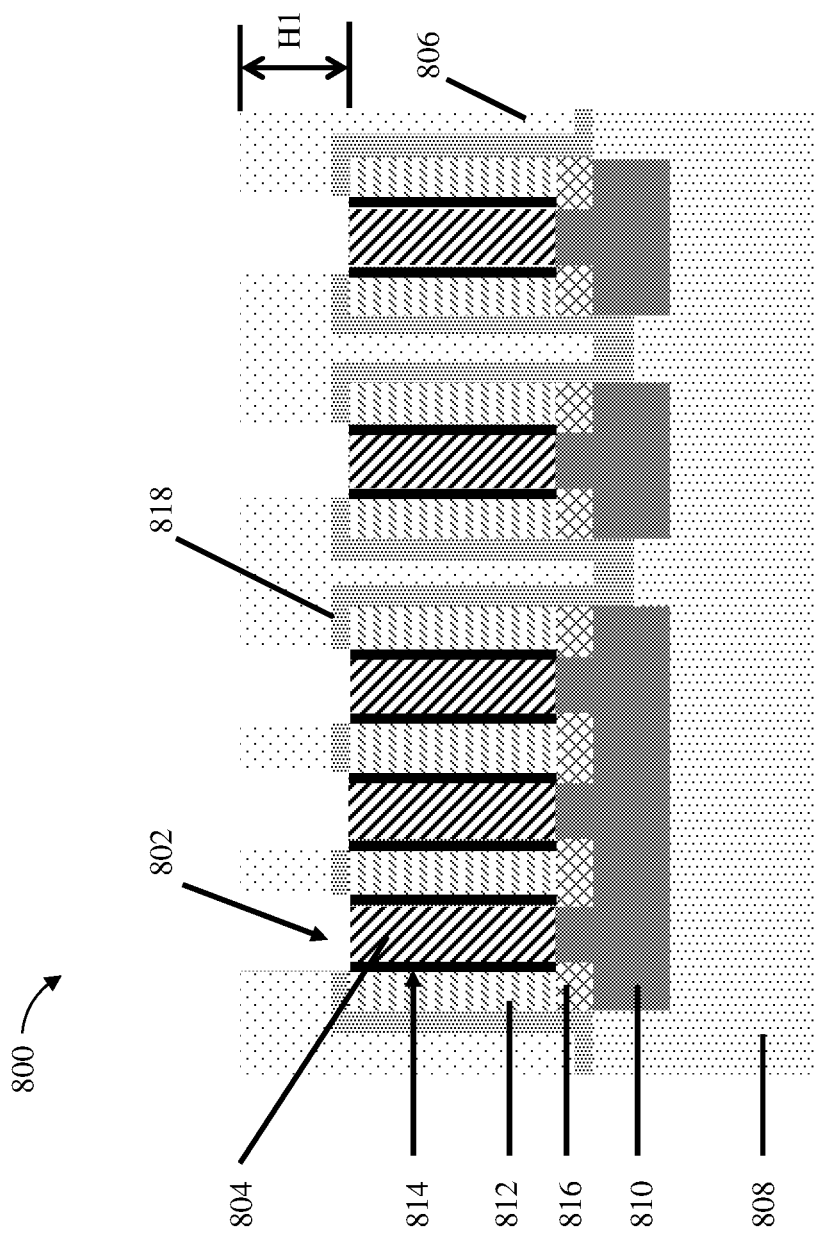
FIG. 8 depicts a cross-sectional view of the structure after exposing a surface of a semiconductor fin according to one or more embodiments of the present invention.

FIG. 8 illustrates a cross-sectional view of a structure 800 after exposing a surface 802 of a semiconductor fin 804. The structure 800 is formed in a like manner as is the structure 100 in FIG. 5, except that the structure 800 does not have a corresponding region (region 400 in FIG. 5) formed in a top portion of an ILD 806. The structure 800 includes a substrate 808, a bottom epitaxy region 810, the semiconductor fin 804 a gate stack 812, a high-K dielectric 814, a bottom spacer 816, and a conformal liner 818. Any known manner of exposing the surface 802 can be utilized. In some embodiments, a directional SiN or SiBCN etch back exposes the surface 802. In some embodiments, a height H1 of the ILD 806 above the surface 802 of the semiconductor fin 804 can be about 90 nm.

Figure 9:
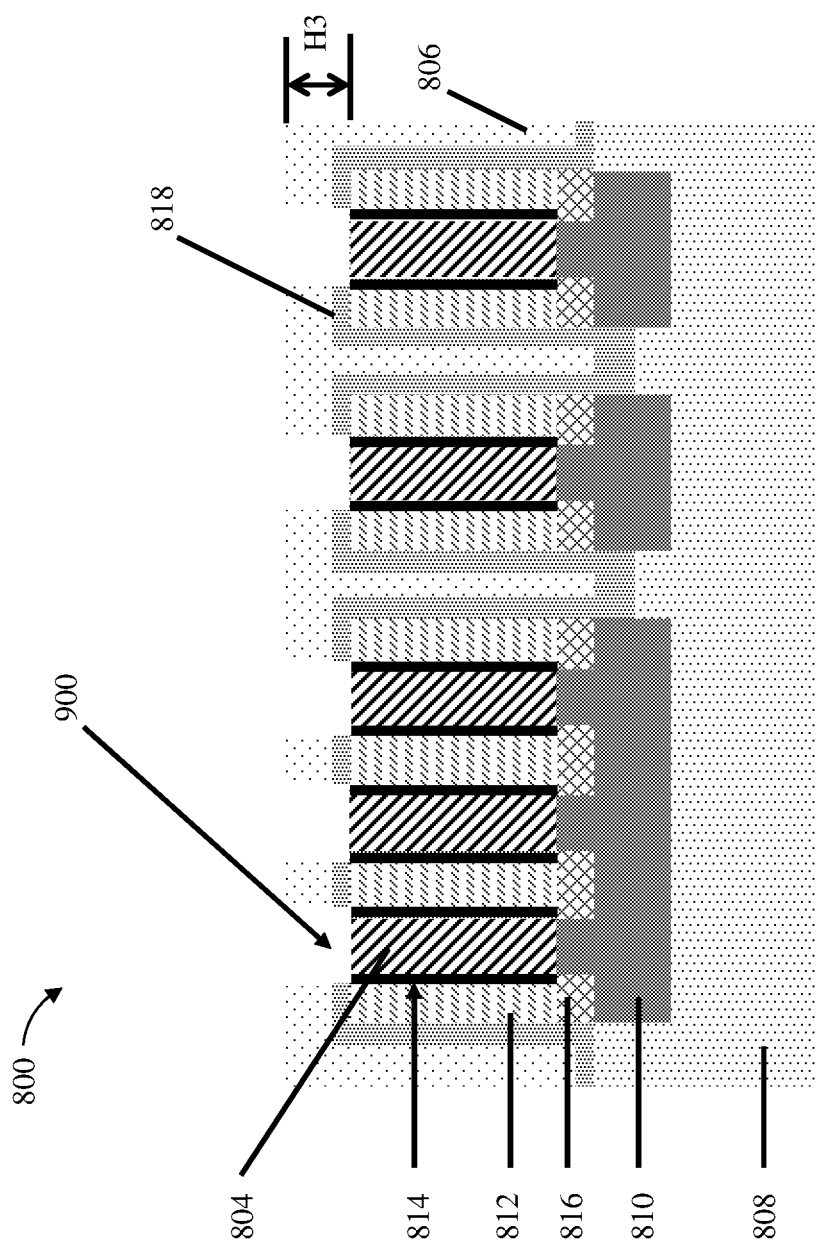
FIG. 9 depicts a cross-sectional view of the structure after pre-cleaning the surface of the semiconductor fin to form pre-cleaned surface according to one or more embodiments of the present invention.

FIG. 9 illustrates a cross-sectional view of the structure 800 after pre-cleaning the surface 802 of the semiconductor fin 804 to form pre-cleaned surface 900. As discussed in detail previously, many technologies are available for pre-cleaning fin surfaces. In some embodiments, a wet etch system is used to pre-clean the surface 802. In other embodiments, a dry etch-type system is used to pre-clean the surface 802. Regardless of the particular system employed to pre-clean the surface 802, the pre-cleaning operation removes any native oxide and any other impurities or contaminants on the surface 802, resulting in a greater interface quality between the pre-cleaned surface 900 and a top source/drain epitaxial layer (illustrated in FIG. 7) formed in a later operation. The pre-cleaning operation reduces the height H1 of the ILD 300 to a height H3. In some embodiments, the height H3 is reduced by about twenty nm (i.e., H1 can be about 20 nm greater than H3) due to ILD 300 having a relatively low etch resistance to the pre-cleaning operation. In some embodiments, the height H3 is reduced by about twenty percent due to ILD 300 having a relatively low etch resistance to the pre-cleaning operation.

Figure 10:
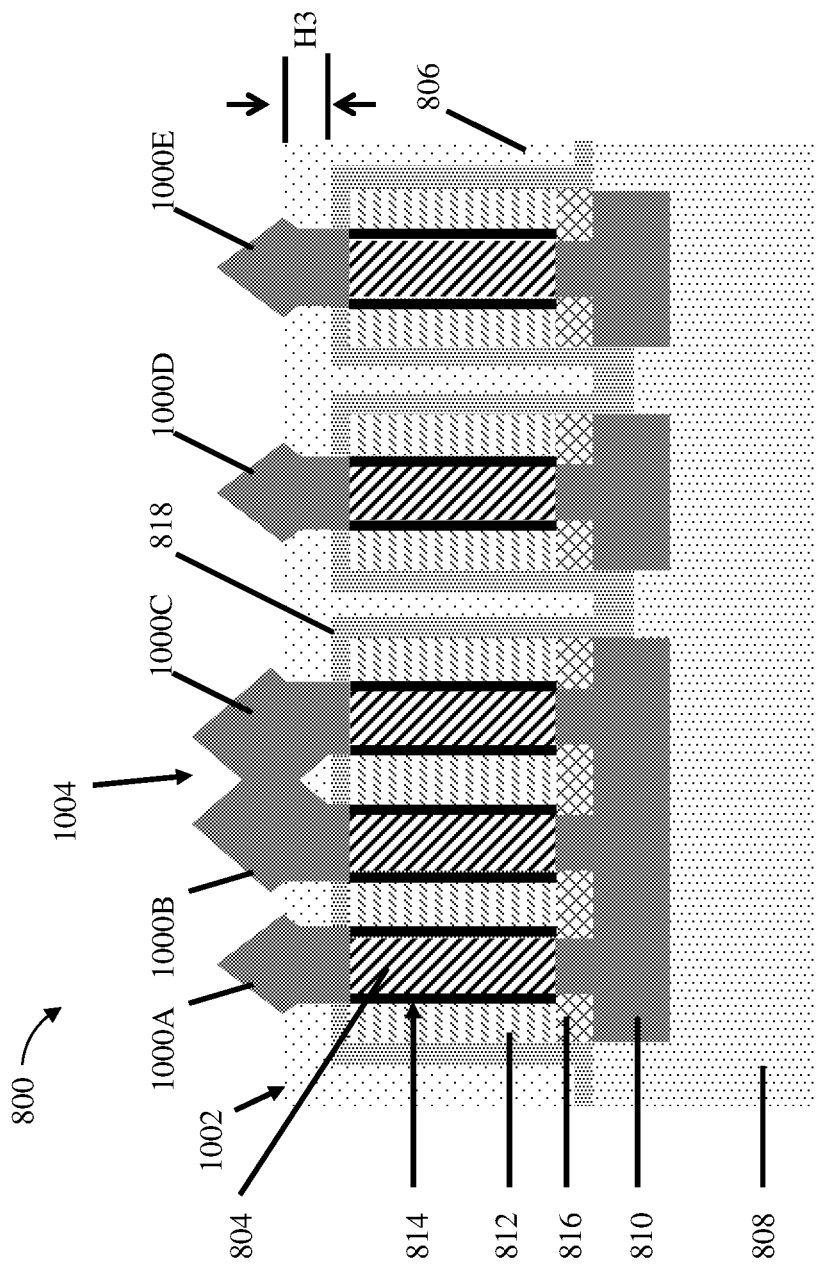
FIG. 10 depicts a cross-sectional view of the structure after forming a plurality of top epitaxy regions on the pre-cleaned surfaces of a plurality of semiconductor fins according to one or more embodiments of the present invention.

FIG. 10 illustrates a cross-sectional view of the structure 800 after forming a plurality of top epitaxy regions 1000A-E on the pre-cleaned surfaces of a plurality of semiconductor fins including semiconductor fin 804. Any known manner of forming the top epitaxy regions 1000A-E can be utilized. In some embodiments, a deposition operation such as, for example, CVD, ECD, MBE, or ALD is employed to form the top epitaxy regions 1000A-E. In some embodiments, the top epitaxy regions 1000A-E extend beyond a top surface 1002 of the ILD 806. In some embodiments, the reduction in dielectric height of the ILD 806 to H3 during the pre-cleaning operation causes an epitaxy merge 1004 between adjacent top epitaxy regions (e.g., 1000B and 1000C in FIG. 10).

Figure 11:
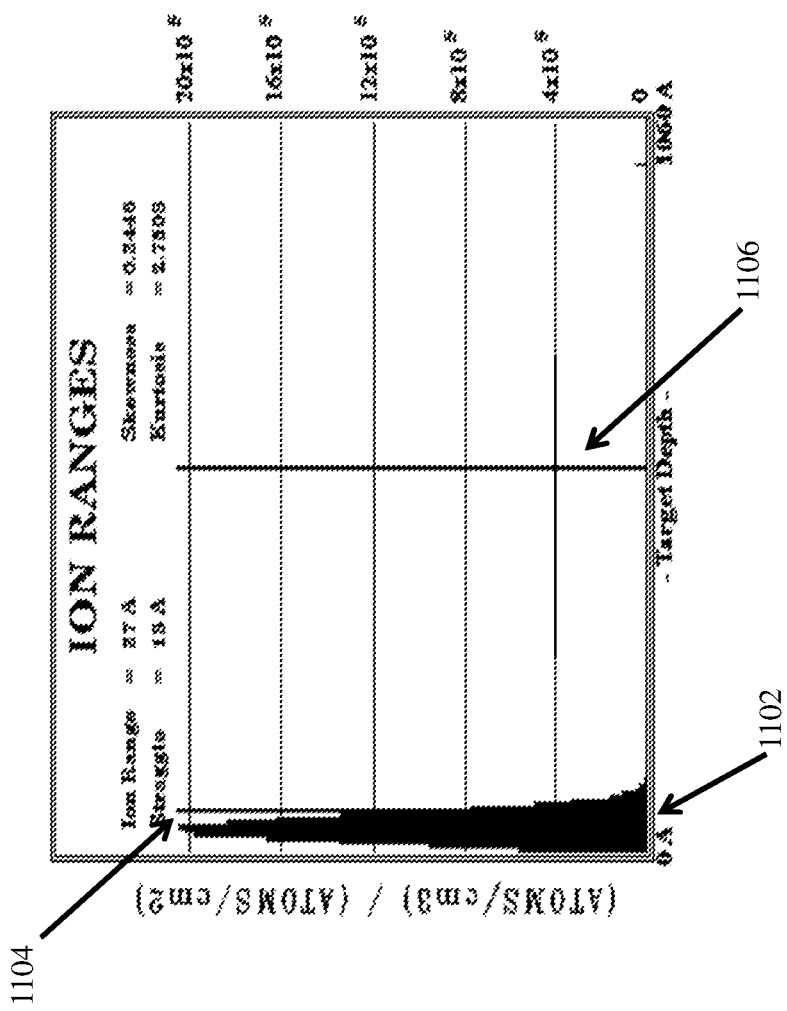
FIG. 11 depicts a nitrogen ion implantation into a SiBCN region, SiN hard mask, and Si fin according to one or more embodiments of the present invention.

FIG. 11 illustrates a nitrogen ion implantation into a SiBCN region 1102, SiN hard mask 1104, and Si fin 1106 in accordance with one or more embodiments of the present invention. In one embodiment, the nitrogen ion implantation is restricted to about 60 angstroms (6 nm) into the SiBCN region 1102, demonstrating limited, or no, ion implantation into the SiN hard mask 1104 during a nitrogen ion implantation operation.

Figure 12:
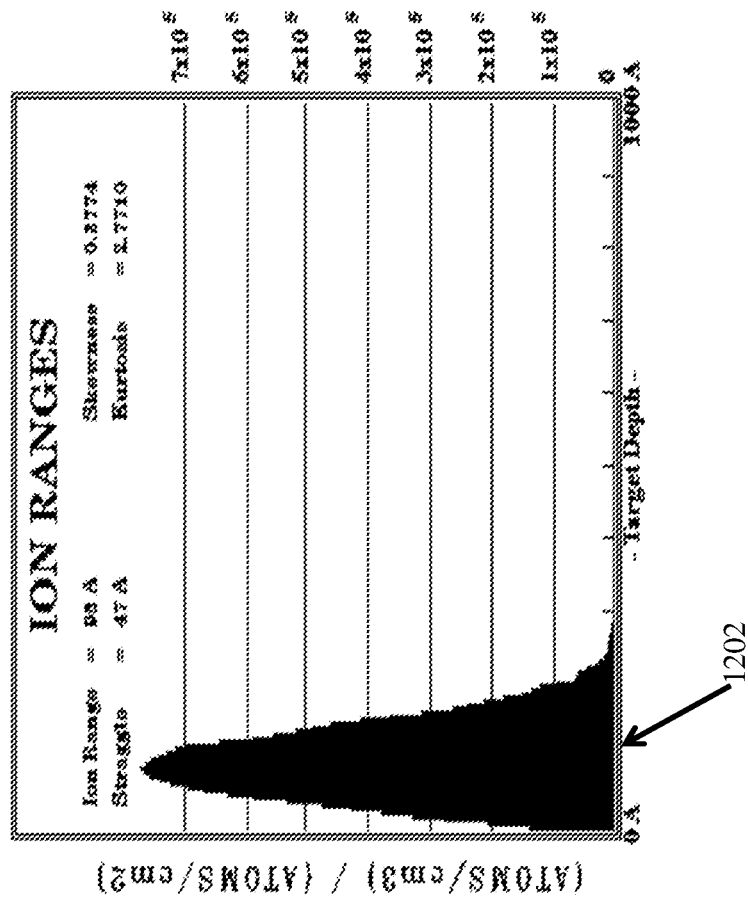
FIG. 12 depicts a nitrogen ion implantation into a $SiO_2$ region according to one or more embodiments of the present invention.

FIG. 12 illustrates a nitrogen ion implantation into a $SiO_2$ region 1202 in accordance with one or more embodiments of the present invention. In one embodiment, the nitrogen ion implantation is able to implant nitrogen to about 200 angstroms (20 nm) into the $SiO_2$ region 1202.

Figure 13:
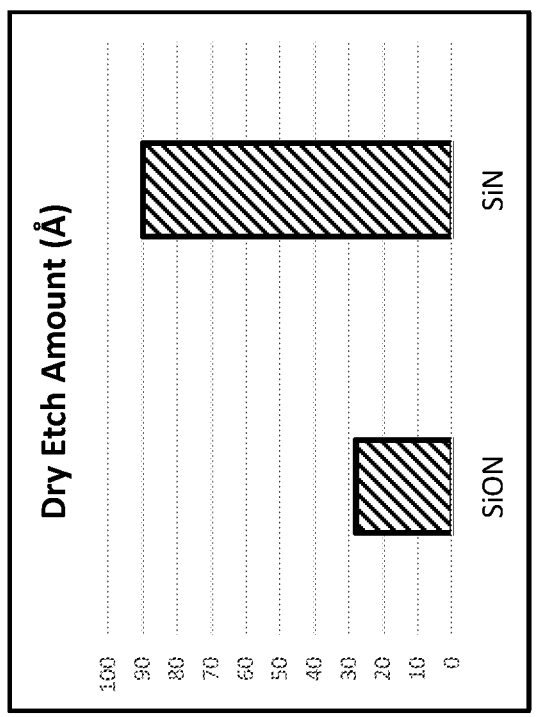
FIG. 13 depicts the relative etching selectivity of a dry etch-type pre-cleaning operation to SiON and SiN according to one or more embodiments of the present invention.

FIG. 13 illustrates the relative etching selectivity of a dry etch-type pre-cleaning operation to SiON and SiN. The etch rate of SiN is about three times greater than the etch rate of SiON during the dry etch-type pre-cleaning operation.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device having an etch-resistant interlayer dielectric (ILD) during a top epitaxy clean, the device comprising:
   a semiconductor structure;
   a dielectric layer formed on the semiconductor structure, the dielectric layer comprising a first portion positioned on a topmost surface of a second portion, the first portion comprising an opening that exposes a topmost surface of a semiconductor fin of the semiconductor structure;
   wherein a first material is implanted in the first portion of the dielectric layer to form a second material, the second material having a higher etch resistance than the second portion of the dielectric layer with respect to an etch material; and
   a top epitaxy region formed on the topmost surface of the semiconductor fin;
   wherein a bottom portion of the top epitaxy region is formed inside the opening.

2. The device of claim 1, the semiconductor structure further comprising:
   a substrate;
   a bottom epitaxy region formed on the substrate;
   the semiconductor fin formed on the bottom epitaxy region;
   a gate stack formed over a channel region of the semiconductor fin, the gate stack positioned on sidewalls of the semiconductor fin; and
   a conformal liner formed on the substrate and the gate stack;
   wherein the first portion of the dielectric layer is positioned adjacent to a top of the gate stack and the second portion of the dielectric layer is positioned over a side portion of the gate stack.

3. The device of claim 1, wherein the dielectric layer is silicon dioxide (SiO2), the first material is nitrogen, and the second material is a silicon oxynitride (SiON).

4. The method of claim 1, wherein the first portion of the dielectric layer has a thickness of about 20 nm.

5. The device of claim 1, wherein the conformal liner is a silicon nitride (SiN) or a silicoboron carbonitride (SiBCN).

6. A semiconductor device having an etch-resistant interlayer dielectric (ILD) during a top epitaxy clean, the device comprising:
   a bottom epitaxy region on a substrate;
   a semiconductor fin on the bottom epitaxy region;
   a gate stack over a channel region of the semiconductor fin, the gate stack positioned on sidewalls of the semiconductor fin;
   a conformal liner on the substrate, the conformal liner extending over sidewalls and a top surface of the gate stack; and
   a dielectric layer on the conformal liner, the dielectric layer comprising a first dielectric material and a second dielectric material on a top surface of the first dielectric material and a surface of the conformal liner, the second dielectric material comprising a byproduct of a top portion of the first dielectric material after a nitrogen ion implantation;
   wherein an etch material removes the first dielectric material at a faster rate than the second dielectric material; and
   wherein the second dielectric material comprises an opening exposing a top surface of the semiconductor fin.

7. The device of claim 6, wherein the nitrogen ion implantation comprises a $1.05 \times 10^{12}$ ions/cm$^2$ dose nitrogen ion implantation.

8. The device of claim 7, wherein the nitrogen ion implantation further comprises an implantation energy of 1 keV.

9. The device of claim 8, wherein the nitrogen ion implantation is at room temperature.

10. The device of claim 6, wherein the second dielectric material comprises the byproduct of the top portion of the first dielectric material after exposure to a plasma treatment.

11. The device of claim 10, wherein the plasma treatment is in a nitrogen environment.

12. The device of claim 6, wherein the first dielectric material comprises silicon dioxide.

13. The device of claim 12, wherein the second dielectric material comprises silicon oxynitride (SiON).

14. The device of claim 6, wherein the second dielectric material comprises a thickness of about 20 nm.

* * * * *